(12) United States Patent
Park (10) Patent No.: US 10,224,092 B2
(45) Date of Patent: Mar. 5, 2019

(54) SEMICONDUCTOR MEMORY DEVICE FOR DIMINISHING PEAK CURRENT IN MULTI-DIE MEMORY STRUCTURE

(71) Applicant: SAMSUNG ELECTRONICS CO., LTD., Suwon-si, Gyeonggi-Do (KR)

(72) Inventor: Minsang Park, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 115 days.

(21) Appl. No.: 15/299,921

(22) Filed: Oct. 21, 2016

(65) Prior Publication Data

US 2017/0154666 A1    Jun. 1, 2017

(30) Foreign Application Priority Data

Nov. 27, 2015    (KR) .................. 10-2015-0167750

(51) Int. Cl.

| G11C 11/00   | (2006.01) |
|--------------|-----------|
| G11C 7/22    | (2006.01) |
| G11C 11/4076 | (2006.01) |
| G11C 11/4074 | (2006.01) |
| G11C 11/4096 | (2006.01) |
| H02M 3/07    | (2006.01) |
| H03K 5/131   | (2014.01) |
| H03K 5/00    | (2006.01) |
| H02M 1/14    | (2006.01) |

(52) U.S. Cl.
CPC ...... *G11C 11/4076* (2013.01); *G11C 11/4074* (2013.01); *G11C 11/4096* (2013.01); *H02M 3/07* (2013.01); *H03K 5/131* (2013.01); *H02M 1/14* (2013.01); *H03K 2005/00058* (2013.01)

(58) Field of Classification Search
CPC . G11C 16/0483; G11C 11/5671; G11C 16/10; G11C 16/3459; G11C 16/08; G11C 16/26; G11C 16/06; G11C 11/5642; G11C 16/14; G11C 2211/5621; G11C 16/28; G11C 8/10; G11C 8/12
See application file for complete search history.

(56) References Cited

U.S. PATENT DOCUMENTS

| 6,434,044 | B1  | 8/2002 | Gongwer et al. |
| 6,577,535 | B2* | 6/2003 | Pasternak ............... G11C 5/14 365/185.11 |
| 7,683,700 | B2  | 3/2010 | Huynh et al. |
| 8,000,134 | B2  | 8/2011 | Cornwell et al. |
| 8,138,820 | B2  | 3/2012 | Gebara et al. |
| 8,680,830 | B2  | 3/2014 | Kudo et al. |
| 8,711,642 | B2* | 4/2014 | Cornwell ............... G11C 5/145 365/185.23 |

(Continued)

*Primary Examiner* — Hien Nguyen
(74) *Attorney, Agent, or Firm* — F. Chau & Associates, LLC (57) ABSTRACT

A semiconductor memory device includes a first memory die, a control circuit, and a signal generator. The first memory die includes at least one charge pump on a memory die. The control circuit is configured to control driving of the at least one charge pump during a time period. The signal generator is configured to generate a control signal that prevents the at least one charge pump of the first memory die not to be driven at a same time with a charge pump in a second memory die different from the first memory die and to apply the generated pump enable control signal to the pump enable unit.

19 Claims, 9 Drawing Sheets

(56) References Cited

U.S. PATENT DOCUMENTS

| | | |
|---|---|---|
| 8,755,242 B2 | 6/2014 | Lee et al. |
| 8,836,412 B2 | 9/2014 | Wang et al. |
| 2007/0263442 A1* | 11/2007 | Cornwell ................ G11C 5/04 365/185.03 |
| 2013/0297852 A1 | 11/2013 | Fai et al. |
| 2014/0293704 A1 | 10/2014 | Ghalam et al. |

* cited by examiner

SEMICONDUCTOR MEMORY DEVICE FOR DIMINISHING PEAK CURRENT IN MULTI-DIE MEMORY STRUCTURE

CROSS-REFERENCE TO RELATED APPLICATIONS

This application claims priority under 35 U.S.C. § 119 to Korean Patent Application No. 10-2015-0167750 filed Nov. 27, 2015, in the Korean Intellectual Property Office, the entire disclosure of which is incorporated by reference in its entirety herein.

BACKGROUND

1. Technical Field

Embodiments of the inventive concept described herein relate to a semiconductor memory device, and more particularly, relate to a semiconductor memory device in which a plurality of memory dies are stacked on a substrate.

2. Discussion of Related Art

A mobile dynamic random access memory (DRAM) may be mounted in an electronic device such as a smartphone for a high-speed operation and low power consumption. Unlike flash memory, DRAM is volatile memory since it does not retain data stored therein when power is removed.

The DRAM may be implemented in the form of a multi-chip package to increase memory capacity. That is, the multi-chip package denotes a structure in which memory dies are vertically stacked in one package. For example, memory dies may be formed on an upper surface and a lower surface of a substrate in a multi-rank structure (e.g., a dual-rank structure), respectively. In the multi-rank structure, a memory die formed on the upper surface and a memory die formed on the lower surface may be capable of receiving a signal provided from a controller in common. Each of the memory dies may include a charge pump that generates a voltage using external power.

SUMMARY

According to an exemplary embodiment of the inventive concept, a semiconductor memory device is provided that includes a first memory die having at least one charge pump, a control circuit configured to control driving of the at least one charge pump during a time period, and a signal generator configured to prevent the at least one charge pump of the first memory die from being driven at a same time with a charge pump in a second memory die different from the first memory die and to apply the generated control signal to the control circuit.

According to an exemplary embodiment of the inventive concept, a semiconductor memory device is provided that includes a first memory die having at least one charge pump, a control circuit configured to control driving of the at least one charge pump during a time period, and a signal generator configured to generate a control signal that causes the at least one charge pump of the first memory die and another charge pump in a second memory die different from the first memory die to operate in a time-distributed manner.

According to an exemplary embodiment of the inventive concept, a semiconductor memory device is provided that includes a first memory die storing a first code and having a clock signal generator and a first controller. The clock signal generator is configured to generate first and second clock signals that together indicate one of the first code and a second code of a second memory die. The first controller activates a first charge pump in the first memory die when the first and second clock signals indicate the first code. The first controller deactivates the first charge pump when the first and second clock signals indicate the second code.

BRIEF DESCRIPTION OF THE FIGURES

The inventive concept will become apparent from the following description with reference to the following figures, wherein like reference numerals refer to like parts throughout the various figures unless otherwise specified, and wherein.

DETAILED DESCRIPTION

Exemplary embodiments of inventive concept will now be described more fully hereinafter with reference to the accompanying drawings, in which exemplary embodiments are shown. It should be noted, however, that the inventive concept is not limited to the following exemplary embodiments, and may be implemented in various forms. Rather, these exemplary embodiments are provided so that the disclosure will be thorough and complete, and will fully convey the scope of the inventive concept to those skilled in the art.

It will be understood that when an element is referred to as being "connected" or "coupled" to another element, it can be directly connected or coupled to the other element or intervening elements may be present.

Figure 1:
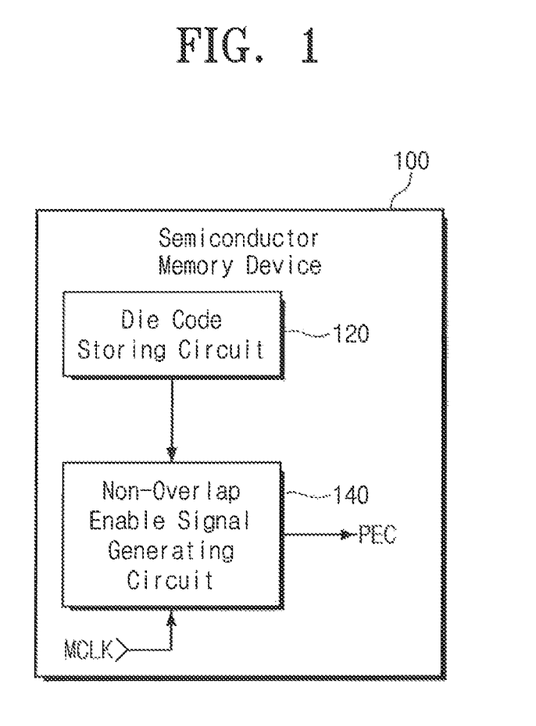
FIG. 1 is a block diagram illustrating a semiconductor memory device according to an exemplary embodiment of the inventive concept.

FIG. 1 is a block diagram illustrating a semiconductor memory device according to an exemplary embodiment of the inventive concept.

Referring to FIG. 1, a semiconductor memory device 100 includes a non-overlapping enable signal generating circuit 140. In addition, the semiconductor memory device 100 further includes a die code storing circuit 120. In an embodiment, the die code storing circuit 120 stores a die code for identifying a memory die. The die code may be stored in a nonvolatile manner. In some embodiments, for convenience of descriptive, the terms "die" and "chip" are interchangeable.

A memory die (or chip) of the semiconductor memory device 100 may include at least one charge pump. The charge pump may be, for example, a charge pump that generates a voltage at a level that is higher than that of a power supply voltage that provides power to the device 100.

The semiconductor memory device 100 may include a pump enable unit that controls the at least one charge pump within a pump driving time period. The pump enable unit may be a control circuit that activates or deactivates one or more charge pumps during a particular period.

The non-overlapping enable signal generating circuit 140 generates a pump enable control signal PEC. In an embodiment, the pump enable control signal PEC prevents at least one charge pump in one die and another charge pump in another die different from the one die from operating at the same time. The generated pump enable control signal PEC is applied to the pump enable unit.

The non-overlapping enable signal generating circuit 140 generates the pump enable control signal PEC using a received at least one matching clock signal MCLK. When a plurality of matching clock signals MCLK are used, frequencies of the matching clock signals MCLK may be different from each other.

At least one charge pump of a memory die is not driven at the same time with a charge pump of another memory die by the non-overlapping enable signal generating circuit 140. The another memory die may be different from the memory die including the at least one charge pump. This may make it possible to reduce the peak current consumption in a semiconductor memory device 100 having a multi-die memory structure.

The semiconductor memory device 100 including the non-overlapping enable signal generating circuit 140 may be a mobile DRAM. Normal memory cells and spare memory cells may be in a memory cell array of the mobile DRAM. The normal memory cells and the spare memory cells may have the same structure (e.g., the same size and form). One DRAM memory cell may be implemented with one access transistor and one storage capacitor. The semiconductor memory device 100 may be a DRAM. When the semiconductor memory device 100 is a DRAM, the die code storing circuit 120 may be implemented using nonvolatile memory cells, a fuse circuit, or a mode register set (MRS) circuit. In an embodiment, the DRAM is a synchronous DRAM (SDRAM). In an embodiment, the SDRAM is a double data rate SDRAM (DDR SDRAM). In an embodiment, the DRAM is a low power double data rate memory (LPDDR) or a mobile DDR (MDDR).

However, embodiments of the inventive concept are not limited to DRAM. For example, a memory cell array included in the memory die may be composed of MRAM cells instead of DRAM memory cells.

A volatile semiconductor memory device such as a static random access memory (SRAM) or a dynamic random access memory (DRAM) may lose data stored therein when a power supply is interrupted. On the other hand, a nonvolatile semiconductor memory device such as a magnetic RAM (MRAM) may retain data stored therein even after a power supply is interrupted. Accordingly, the nonvolatile semiconductor memory device may be used to store data when a user does not want to lose data due to power failure or power interruption. In particular, when a memory die (e.g., one of a first memory die and a second memory die) includes a spin transfer torque magneto resistive random access memory (STT-MRAM), the memory die has a characteristic of the MRAM as well as a characteristic of the DRAM. A STT-MRAM cell may include a magnetic tunnel junction (MTJ) element and a selection transistor. The MTJ element may include a fixed layer, a free layer, and a tunnel layer formed therebetween. A magnetization direction of the fixed layer may be fixed; a magnetization direction of the free layer may be the same as or opposite to the magnetization direction of the fixed layer based on a condition. When the semiconductor memory device 100 is the MRAM, the die code storing circuit 120 is implemented using the MRAM cells.

Power consumption when the semiconductor memory device is in a standby mode may be smaller than that when the semiconductor memory device is in an active mode. Thus, it may not be necessary to turn on all charge pumps in the memory dies during the standby mode. In addition, in this case, a charge transfer time may be changed by adjusting the number of transistors that operate for a charge pump. The active mode may indicate a mode in which a word line voltage is set to a high voltage having a level higher than that of a power supply voltage. A word line of a memory cell selected in a read or write operation may be activated to have the level of the high voltage.

The semiconductor memory device of FIG. 1 may include a memory system together with other components. For example, in a computing device, the memory system may include a memory controller as the other components and the semiconductor memory device. The computing device may include an information processing device or a computer. In an embodiment, the computing device includes a modulator/demodulator (MODEM), a central processing unit (CPU), and a user interface, which are electrically connected to each other through a system bus, in addition to the memory system. Data processed by the CPU or data inputted from an external device may be stored in the memory system.

The semiconductor memory device 100 of FIG. 1 may include a volatile memory or a nonvolatile memory. The volatile memory may be a dynamic random access memory (DRAM), a static random access memory (SRAM), a thyristor RAM (TRAM), a zero capacitor RAM (Z-RAM), or a twin transistor RAM (TTRAM).

The nonvolatile memory may be an electrically erasable programmable read-only memory (EEPROM), a flash memory, a magnetic RAM (MRAM), a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM, a polymer RAM (PoRAM), a nano-floating gate memory (NFGM), a holographic memory, a molecular electronic memory device, or an insulator resistance change memory. One or more bits may be stored in a unit cell of the nonvolatile memory.

Figure 2:
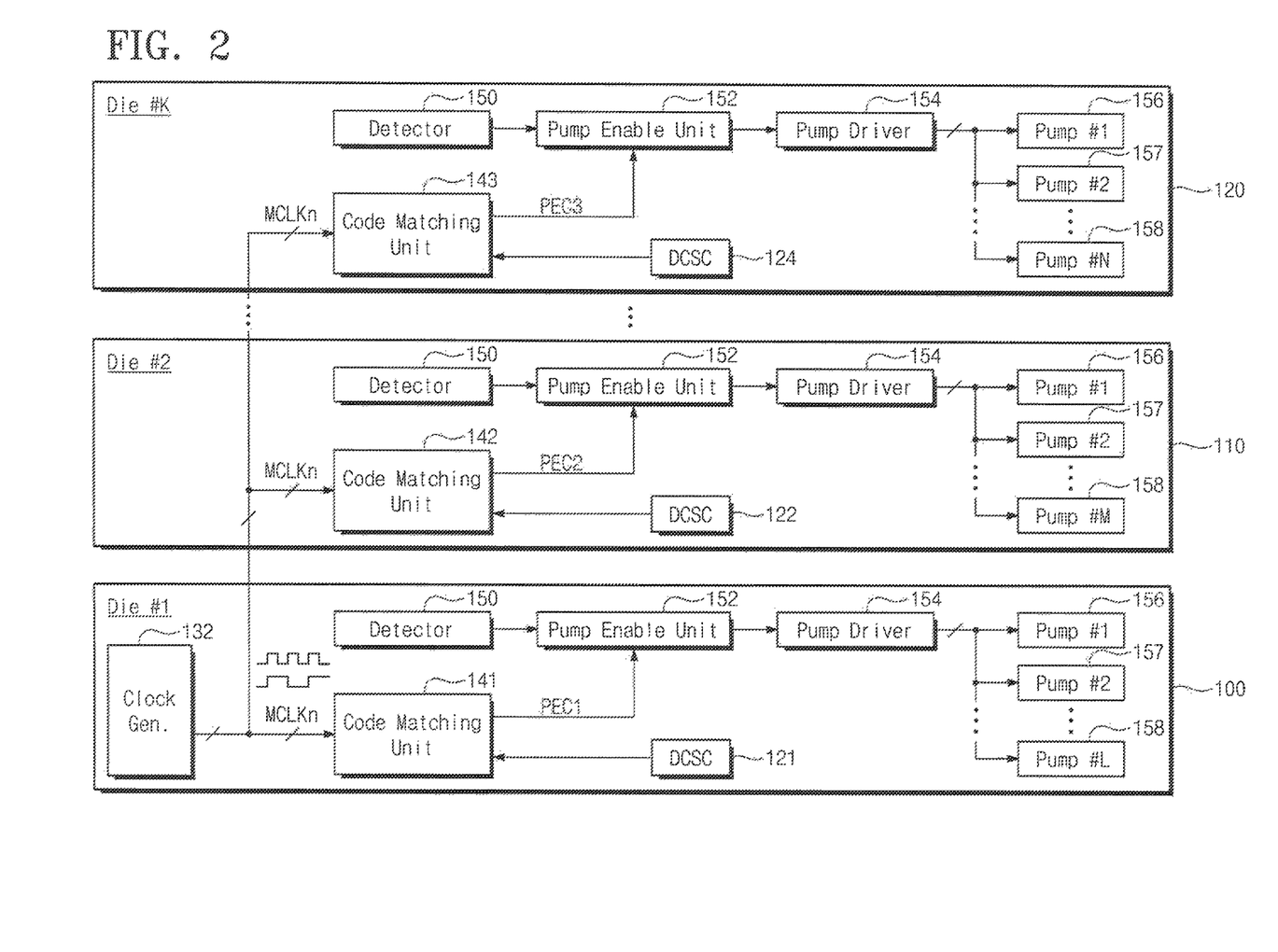
FIG. 2 is a detailed block diagram illustrating a semiconductor memory device of FIG. 1 applied to a multi-die memory structure according to an exemplary embodiment of the inventive concept.

FIG. 2 is a detailed block diagram illustrating the semiconductor memory device of FIG. 1 applied to a multi-die memory structure.

Referring to FIG. 2, the semiconductor memory device includes "K" (i.e., K being a natural number of 3 or more) memory dies 100, 110, . . . , and 120. Each of the memory dies 100 to 120 includes charge pumps 156, 157, . . . , and 158.

A first memory die 100 may be one memory chip. Thus, the first memory die 100 of FIG. 2 may correspond to the semiconductor memory device 100 of FIG. 1.

The first memory die 100 includes a code matching unit 141. The code matching unit 141 according to an embodiment of the inventive concept is a circuit block implemented with the non-overlapping enable signal generating circuit 140 of FIG. 1.

The first memory die 100 includes a die code storing circuit (DCSC) 121. The DCSC 121 may store a unique code that identifies the first memory die 100. Thus, the DCSC 121 may be implemented with the die code storing circuit 120 of FIG. 1. For example, the DCSC 121 may store a code of "00" as a die code.

The first memory die 100 furthers include a clock generator 132. The clock generator 132 may generate first and second matching clock signals MCLKn. In an embodiment, clock frequencies of the first and second matching clock signals MCLKn are different from each other. In FIG. 2, the clock generator 132 is located within the first memory die 100. However, embodiments of the inventive concept are not limited thereto. For example, the clock generator 132 may be located within a second memory die 110 or a $K^{th}$ (K being a natural number of 3 or more) memory die 120. In an exemplary embodiment, the first clock generator 132 is not located in any of the memory dies, and the first and second matching clock signals MCLKn are provided from an external device such as a memory controller.

In an exemplary embodiment, the clock generator 132 of FIG. 2 periodically cycles through each of the die codes to select a next one of the die codes and changes levels of the first and second matching clock signals so they together match the selected one die code. For example, if two die codes are being supported, the clock generator 132 could alternate between indicating the first die code and the second die code, if three die codes are being supported, the clock generator 132 could alternate between indicating the first die code, the second die code, and the third die code, etc.

The first memory die 100 includes a detector 150, a pump enable unit 152, and the pump driver 154 which drives 'L' charge pumps 156 to 158 (L being a natural number of 3 or more). In an embodiment, the pump driver 154 drives less than 3 charge pumps.

In an embodiment, the detector 150 is configured to detect whether a level of an output voltage of each of the charge pumps 156 to 158 is lower than that of a reference voltage or not. The detector 150 may output an up/down signal (UP/DN) as the detected result. In an embodiment, the detector 150 is implemented by a comparator. The UP signal indicates that the output voltage is higher than the reference voltage and the DN signal indicates that the output voltage is lower than the reference voltage.

The pump enable unit 152 may include an oscillator circuit such as a ring oscillator. In an embodiment, the pump enable unit 152 outputs an oscillating drive signal based on the detected result of the detector 150. In an embodiment, the pump enable unit 152 is activated when a first pump enable control signal PEC1 is in an active state. In an embodiment, the pump enable unit 152 does not output the oscillating drive signal when the first pump enable control signal PEC1 is in an inactive state, and outputs the oscillating driving signal when the first pump enable control signal PEC1 is in the active state.

In an embodiment, the pump driver 154 outputs a pump drive signal in response to the oscillating drive signal. The pump drive signal may be an oscillation clock signal.

For example, the charge pump 156 may be a charge pump which performs a charge pump operation based on the oscillation clock signal.

When logical states of the first and second matching clock signals MCLKn are the same as those of a first die code, the code matching unit 141 outputs the first pump enable control signal PEC1 at an active state. When logical states of the first and second matching clock signals MCLKn are different from those of the first die code, the code matching unit 141 outputs the first pump enable control signal PEC1 at an inactive state. When the first pump enable control signal PEC1 at an inactive state is outputted, the pump enable unit 152 is inactivated, and thus the pump enable unit 152 does not output the oscillating drive signal. Accordingly, a charge pump (e.g., 156) to be driven does not operate until the first pump enable control signal PEC1 is activated. At least one of charge pumps 156 to 158 in the second memory die 110 may operate while the charge pumps 156 to 158 in the first memory die 100 do not operate. Because the charge pumps do not operate at the same time, the peak current consumption of all memory dies may be reduced.

The second memory die 110 may be one memory chip. The second memory die 110 may be adjacent to the first memory die 110.

The second memory die 110 includes a code matching unit 142. The code matching unit 142 according to an embodiment of the inventive concept is a circuit block implemented with the non-overlapping enable signal generating circuit 140 of FIG. 1.

The second memory die 110 includes a die code storing circuit (DCSC) 122. The second DCSC 122 in the second memory die 110 stores a unique code identifying the second memory die 110. For example, the second DCSC 122 may store a code of "01" as a die code.

A second pump enable control signal PEC2 at an active state is outputted by a code matching unit 142 to the second memory die 110 at a point in time when logical states of the first and second matching clock signals MCLKn are changed into "01".

The code matching unit 142 receives the first and second matching clock signals MCLKn.

To drive 'M' charge pumps 156 to 158 (M being a natural number of 3 or more), the second memory die 110 includes a detector 150, a pump enable unit 152, and a pump driver 154.

A function and an operation of the detector 150 in the second memory die 110 may be the same as those of the detector 150 in the first memory die 100.

A function and an operation of the pump enable unit 152 in the second memory die 110 may be the same as those of the pump enable unit 152 in the first memory die 100.

When the second pump enable control signal PEC2 is in an active state, the pump enable unit 152 in the second memory die 110 is activated. When the second pump enable control signal PEC2 is in an inactive state, the pump enable unit 152 does not output the oscillating drive signal. When the second pump enable control signal PEC2 is in the active state, the pump enable unit 152 outputs the oscillating drive signal.

Functions and operations of the pump driver 154 and the charge pump 156 in the second memory die 110 may be the same as those of the first pump driver 154 and the charge pump 156 in the first memory die 100.

When logical states of the first and second matching clock signals MCLKn are the same as those of a second die code, the code matching unit 142 in the second memory die 110 outputs a second pump enable control signal PEC2 at an active state. When logical states of the first and second matching clock signals MCLKn are different from those of the second die code, the second code matching unit 142 outputs the second pump enable control signal PEC2 at an inactive state. When the second pump enable control signal PEC2 of the inactive state is outputted, the pump enable unit 152 in the second memory die 110 is inactivated, and thus the pump enable unit 152 does not output the oscillating drive signal. For this reason, at least one charge pump (e.g., 157) that is to be driven in the second memory die 110 does not operate until the second pump enable control signal PEC2 is in an active state. At least one charge pump in the first memory die 100 may operate while the charge pumps 156 to 158 in the second memory die 110 do not operate. According to the above description, charge pumps implemented in multi-die memory structure may operate in a time-distributed manner, thereby reducing the peak current consumption of the semiconductor memory device.

A configuration of the K$^{th}$ memory die 120 may be the same as that of each of other memory dies as described above. A K$^{th}$ DCSC 124 in the K$^{th}$ memory die 120 stores a unique code identifying the K$^{th}$ memory die 120. For example, the K$^{th}$ DCSC 124 may store a code of "10" as a die code.

Figure 3:
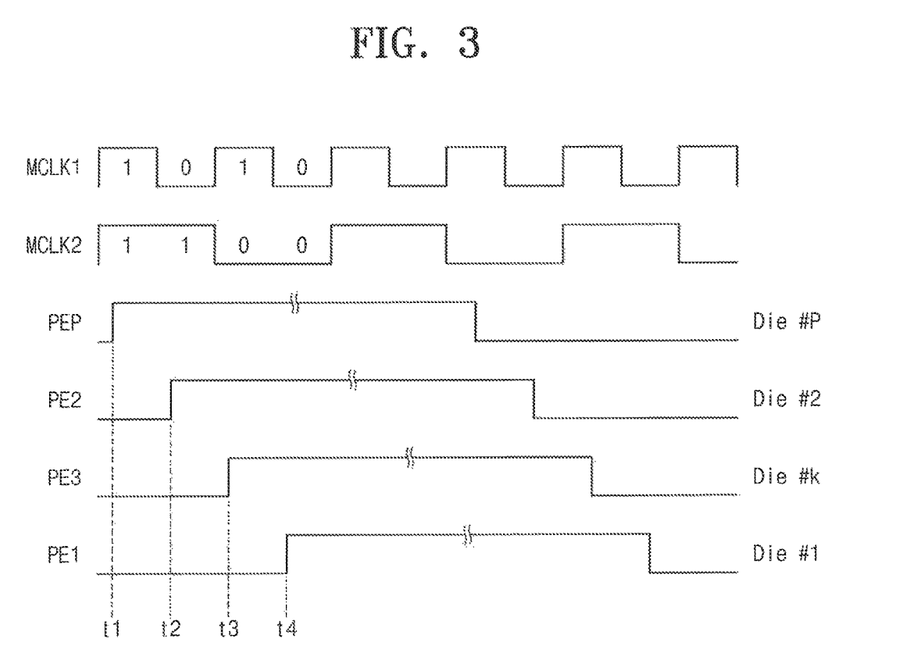
FIG. 3 is a timing diagram illustrating an operation of a semiconductor memory device shown in FIG. 2.

FIG. 3 is a timing diagram illustrating an operation of the semiconductor memory device shown in FIG. 2.

Referring to FIG. 3, for example, a first waveform MCLK1 corresponds to a first matching clock signal MCLK1, and a second waveform MCLK2 corresponds to a second matching clock signal MCLK2. An embodiment of the inventive concept is exemplified as a frequency of the first matching clock signal MCLK1 is higher than that of the first matching clock signal MCLK 2. However, embodiments of the inventive concept are not limited thereto. For example, a frequency of the second matching clock signal MCLK 2 may be higher than that of the first matching clock signal MCLK1. In addition, when the memory dies are mounted on a substrate, frequencies of the first and second matching clock signals MCLK1 and MCLK2 may be the same as each other.

When a first die code stored in the first die code storing circuit (DCSC) 121 of the first memory die 100 is, for example, a code of "00", like waveform PE1 illustrated in FIG. 3, the first pump enable control signal PEC1 is activated at t4. This is because logical states (e.g., "00") of the first and second matching clock signals MCLKn are the same as those (e.g., "00") of a first die code at t4.

When a second die code stored in the second die code storing circuit (DCSC) 122 is, for example, a code of "01" like waveform PE2 illustrated in of FIG. 3, the second pump enable control signal PEC2 is activated at t2. This is because logical states ("01") of the first and second matching clock signals MCLK1 and MCLK2 are the same as those (e.g., "01") of a second die code at t2.

When a K$^{th}$ die code stored in the K$^{th}$ DCSC 124 is, for example, a code of "10" like waveform PE3 illustrated in FIG. 3, a K$^{th}$ pump enable control signal PEC3 is activated at t3. This is because logical states (e.g., "10") of the first and second matching clock signals MCLK1 and MCLK2 are the same as those (e.g., "10") of a second die code at t3.

For example, the first matching clock signal MCLK1 corresponds to the first bit of a die code and the second matching clock signal MCLK2 corresponds to the second bit of the die code. In an embodiment, the waveforms PE1, PE2, PE3, and PEP of FIG. 3 are generated by delaying a waveform by different amounts to represent different die codes. For example, waveform PEP is not delayed, and can thus represent a die code of "11". Waveform PE2 is delayed with respect to waveform PEP by time t2−t1, and can thus represent a die code of "10". Waveform PE3 is delayed with respect to waveform PEP by time t3−t1, and can thus represent a die code of "01". Waveform PE1 is delayed with respect to waveform PEP by time t4−t1, and can thus represent a die code of "00". In an embodiment, the die code storing circuits include one or more registers, latches, or memories to store a die code therein.

As described with reference to FIG. 3, points in time when pump enable control signals are respectively activated may be different from each other. According to the above description, charge pumps in each memory die do not operate at the same time but in a time-distributed manner, thereby reducing the peak current consumption of the semiconductor memory device.

Figure 4:
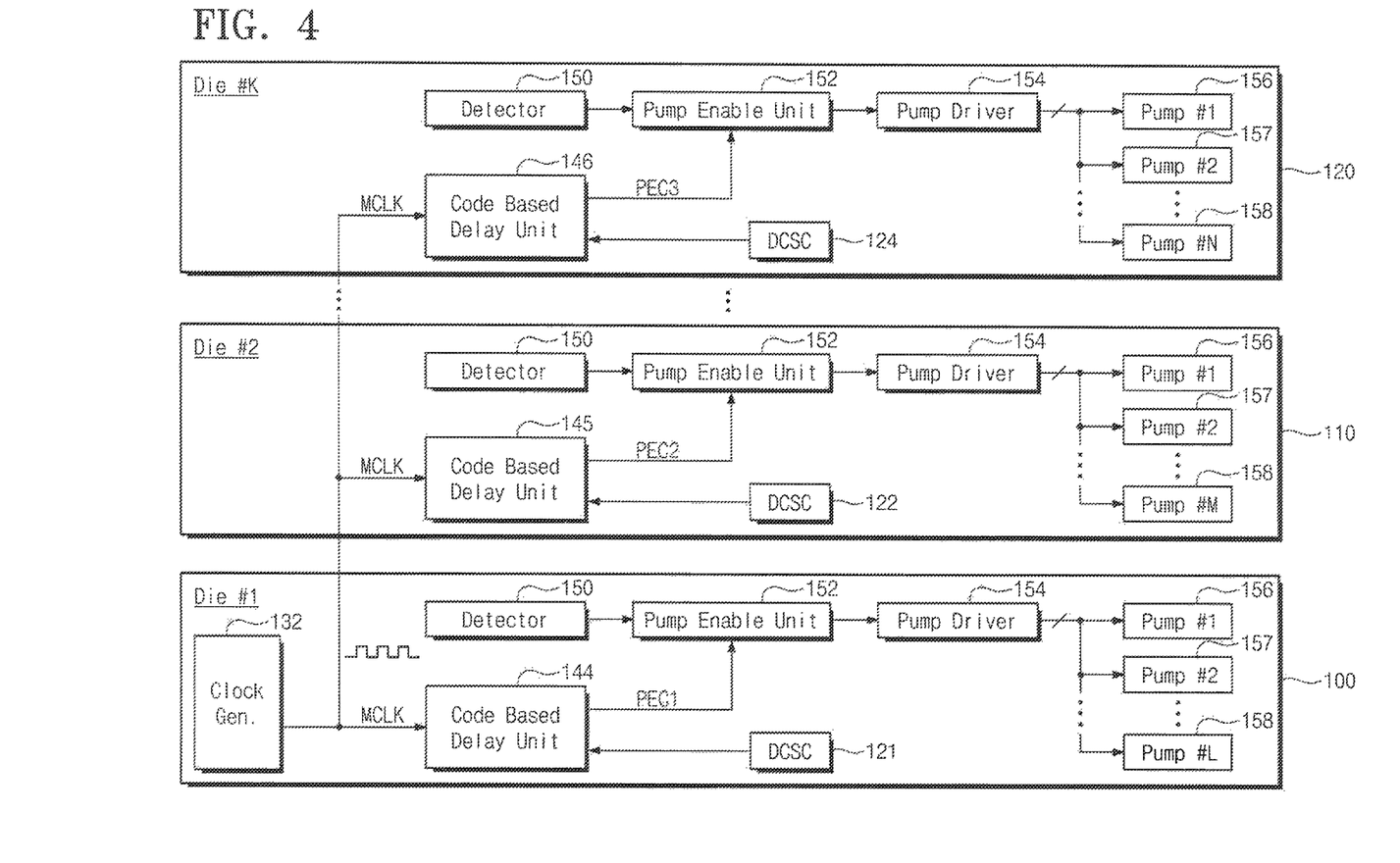
FIG. 4 is a detailed block diagram illustrating a semiconductor memory device of FIG. 1 applied to a multi-die memory structure, according to an exemplary embodiment of the inventive concept.
Figure 5:
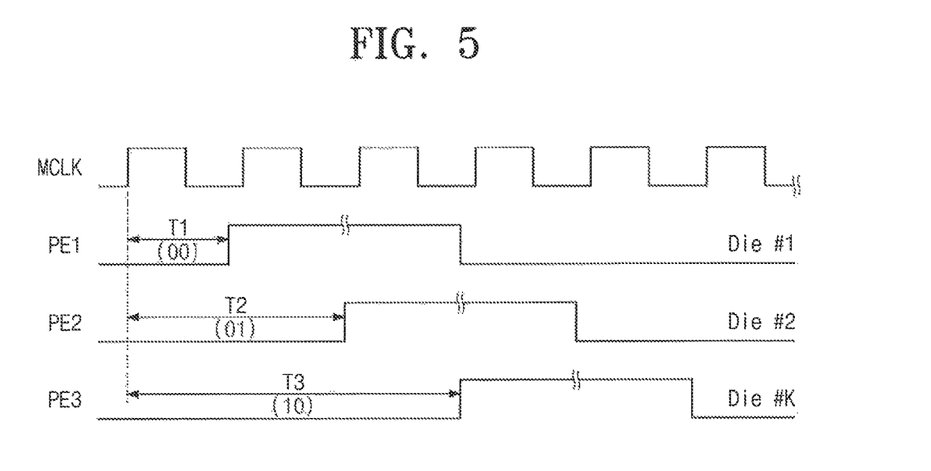
FIG. 5 is a timing diagram of a semiconductor memory device shown in FIG. 4.

FIG. 4 is a block diagram illustrating the semiconductor memory device of FIG. 1 having a multi-die memory structure, according to an exemplary embodiment of the inventive concept. In addition, FIG. 5 is a timing diagram of the semiconductor memory device shown in FIG. 4.

Referring to FIG. 4, each of "K" memory dies (K being a natural number of 3 or more) 100 to 120 may include charge pumps 156 to 158.

When a first memory die 100 of FIG. 4 is one memory chip, the first memory die 100 of FIG. 4 may correspond to the semiconductor memory device 100 of FIG. 1.

The first memory die 100 of FIG. 4 includes a code-based delay unit 144. The code-based delay unit 144 according to an embodiment of the inventive concept is a circuit block implemented with the non-overlapping enable signal generating circuit 140 of FIG. 1.

The first memory die 100 of FIG. 4 includes a first die code storing circuit (DCSC) 121. The first DCSC 121 stores a unique code identifying the first memory die 100. The first DCSC 121 according to an embodiment of the inventive concept corresponds to the die code storing circuit 120 of FIG. 1.

The first memory die 100 of FIG. 4 further includes a clock generator 132. Unlike the clock generator 132 of FIG. 2, the clock generator 132 of FIG. 4 generates a single matching clock signal MCLK. A clock frequency of the single matching clock signal MCLK may be a specific frequency. The clock generator 132 of FIG. 4 may be located in the first memory die 100. However, embodiments of the inventive concept are not limited thereto. The clock generator 132 of FIG. 4 may be located in different memory dies (e.g., the second memory die 110 or a K$^{th}$ memory die 120). In an embodiment, the clock generator 132 is not present in any of the memory dies 100, 110, . . . , and 120, and thus the matching clock signal MCLK may be provided from an external device such as a host or a memory controller.

To drive 'L' (L being a natural number of 3 or more) charge pumps 156, 157, . . . , and 158, the first memory die 100 of FIG. 4 may include a first detector 150 a pump enable unit 152, and a first pump driver 154.

In an embodiment, the first detector 150 in FIG. 4 detects whether a level of an output voltage of at least one of the charge pumps 156 to 158 is lower than that of a reference voltage or not. The first detector 150 may output an up/down signal (UP/DN) based on the detected result. In an embodiment, the detector 150 of FIG. 4 is implemented by a comparator. The UP signal indicates that the output voltage is higher than the reference voltage and the DN signal indicates that the output voltage is lower than the reference voltage.

A pump enable unit 152 in the first memory die 100 of FIG. 4 may include an oscillator circuit. The pump enable unit 152 may output an oscillating drive signal based on the detected result of the first detector 150. In an embodiment, the pump enable unit 152 is activated when a first pump enable control signal PEC1 is activated. When the first pump enable control signal PEC1 is inactivated, the pump enable unit 152 does not output the oscillating drive signal. When the first pump enable control signal PEC1 is activated, the pump enable unit 152 outputs the oscillating drive signal.

The first pump driver 154 may output a pump drive signal in response to the oscillating drive signal. The pump drive signal may be outputted in the form of oscillation clock signal. A charge pump 156 may generate a target voltage in response to the oscillation clock signal.

In an embodiment, the code-based delay unit 144 delays the matching clock signal MCLK to generate the first pump enable control signal PEC1. A delay of the matching clock signal may be changed according to a first die code. For example, when the first die code is a code of "00", in FIG. 5, the code-based delay unit 144 outputs as the first pump enable control signal PEC1 a waveform PE1 that is delayed by T1 from a point in time when the matching clock signal MCLK is received.

A second memory die 110 implemented with a memory chip may be adjacent to the first memory die 100 in FIG. 4.

The second memory die 110 includes a code-based delay unit 145. The second memory die 110 may include a second die code storing circuit (DCSC) 122. The second DCSC 122 of FIG. 4 store a unique die code identifying the second memory die 110. For example, the second DCSC 122 may store a code of "01" as a die code.

Thus, the code-based delay unit 145 delays the matching clock signal MCLK to generate the second pump enable control signal PEC2. A delay of the matching clock signal MCLK may be changed according to a second die code (e.g., 01). For example, in FIG. 5, the code-based delay unit 145 outputs a waveform PE2 as the second pump enable control signal PEC2. The waveform PE2 is a waveform delayed by T2 from a point in time when the matching clock signal MCLK is received.

In the $K^{th}$ memory die 120, a code-based delay unit 146 may be configured substantially the same manner as the remaining memory dies except that the code-based delay unit 146 is connected to a $K^{th}$ die code storing circuit (DCSC) 124. The $K^{th}$ DCSC 124 stores a unique code identifying the $K^{th}$ memory die 120. For example, the $K^{th}$ DCSC 124 may store a code of "10" as a die code.

Thus, the code-based delay unit 146 may delay the matching clock signals MCLK to generate a $K^{th}$ pump enable control signal PEC3. A delay of the matching clock signals MCLK may be changed according to a $K^{th}$ die code. For example, in FIG. 5, the code-based delay unit 146 may output a waveform PE3 as the $K^{th}$ pump enable control signal PEC3. A waveform PE3 is a waveform delayed by T3 based on a point in time when the matching clock signal MCLK is received.

In an embodiment, a code based delay unit 144 includes a delay circuit with a configurable delay amount. The delay amount may be configured based on the value stored in the DCSC 121. In an embodiment, the code based delay unit 144 does not delay the matching clock signal MCLK to represent one of the die codes. For example, the code base delay unit 144 could allow the matching clock signal MCLK to pass through without delay to represent a die code of "11".

According to the above description, when a single matching clock signal illustrated in FIG. 4 is used, charge pumps implemented in multi-die memory structure do not be operate at the same time, thereby reducing the peak current consumption of the semiconductor memory device.

Figure 6:
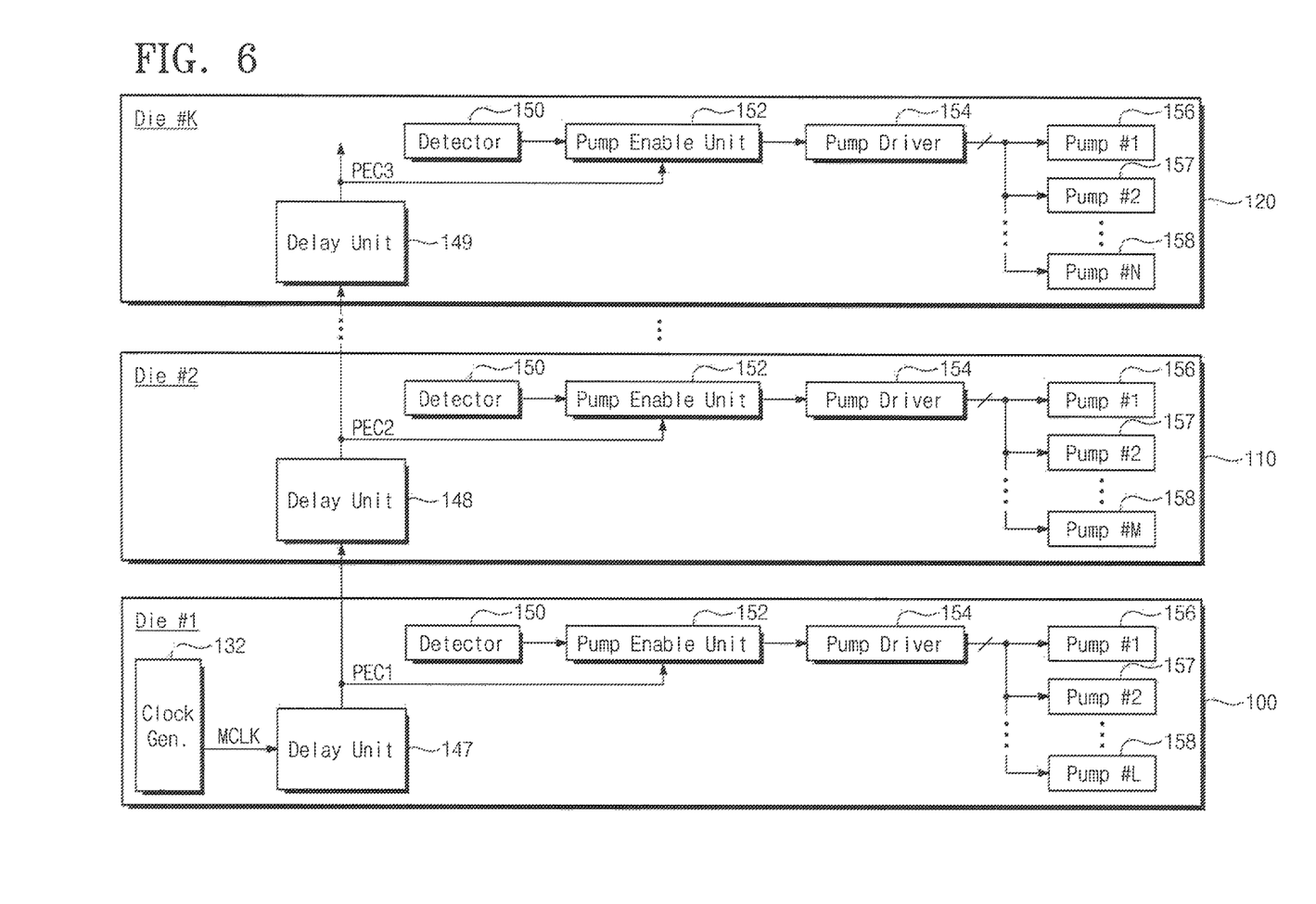
FIG. 6 is a detailed block diagram illustrating a semiconductor memory device of FIG. 1 having a multi-die memory structure, according to an exemplary embodiment of the inventive concept.
Figure 7:
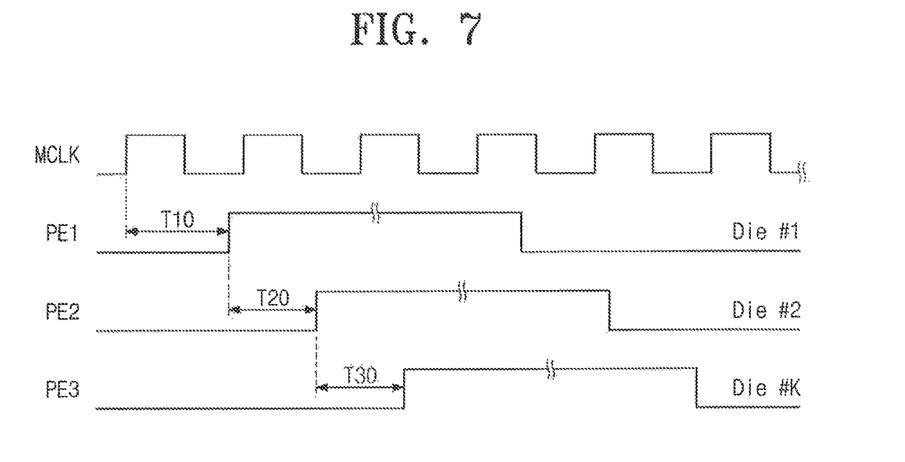
FIG. 7 is a timing diagram of a semiconductor memory device shown in FIG. 6.

FIG. 6 is a block diagram illustrating a semiconductor memory device of FIG. 1 having a multi-die memory structure according to an exemplary embodiment of the inventive concept. In addition, FIG. 7 is a timing diagram of the semiconductor memory device shown in FIG. 6.

Unlike the embodiment illustrated in FIG. 4, the embodiment illustrated in FIG. 6 does not include a die code storage circuit (DCSC).

Referring to FIG. 6, each of "K" (K being a natural number of 3 or more) memory dies 100, 110, . . . , and 120 includes charge pumps 156, 157, . . . , and 158.

Because a first memory die 100 of FIG. 6 is a memory chip, the first memory die 100 may correspond to the semiconductor memory device 100 of FIG. 1.

The first memory die 100 of FIG. 6 includes a delay unit 147. The delay unit 147 may be a circuit block implemented with the non-overlapping enable signal generating circuit 140 of FIG. 1.

The first memory die 100 further includes a clock generator 132. Like the clock generator 132 illustrated in FIG. 4, the clock generator 132 of FIG. 6 generates a single matching clock signal MCLK. A clock frequency of the matching clock signal MCLK may be a specific frequency. An embodiment of the inventive concept is exemplified as the clock generator 132 of FIG. 6 being located in the first memory die 100. However, embodiments of the inventive concept are not limited thereto. For example, the clock generator 132 may be located in a different memory die (i.e., the second memory die 110 or the $K^{th}$ memory die 120). In an embodiment, the clock generator 132 is not located in any of the memory dies 100, 110, . . . , 120, and thus the matching clock signal MCLK may be provided from an external device such as a memory controller.

To drive 'L' charge pumps 156 to 158 (L being a natural number of 3 or more), the first memory die 100 of FIG. 6 may include a first detector 150, a pump enable unit 152, and a first pump driver 154

Because a configuration and operation of the first detector 150 and the pump enable unit 152 are the same as or similar to that of FIG. 4, the pump enable unit 152 of FIG. 6 may output an oscillating drive signal based on the detected result of the first detector 150. The pump enable unit 152 is activated in response to an activation of a first pump enable control signal PEC1. When the first pump enable control signal PEC1 in FIG. 6 is in an inactive state, the pump enable unit 152 does not output the oscillating drive signal. When the first pump enable control signal PEC1 is in the active state, the pump enable unit 152 in FIG. 6 outputs the oscillating drive signal.

A configuration and operation of pump driver 154 and charge pumps 156, 157, . . . , 158 of FIG. 6 may also be the same as or similar to those of FIG. 4.

A delay unit 147 having internal delay elements may delay the matching clock signal MCLK by a set delay to generate the first pump enable control signal PEC1. For example, in FIG. 7, the delay unit 147 outputs as the first pump enable control signal PEC1 the waveform PE1 that is delayed by a delay time T10 from a point in time when the matching clock signal MCLK is provided. Here, the delay time T10 may be several to several tens of nanoseconds.

The delayed matching clock signal MCLK (e.g., PEC1) in the first memory die 110 may be provided as a delay input to a different memory die.

A second memory die 110 forming a different memory chip may be adjacent to the first memory die 100.

The second memory die 110 includes a delay unit 148. The delay unit 148 receives the delayed matching clock signal MCLK from the delay unit 147 in the first memory die 100. The delay unit 148 delays the matching clock signal MCLK that is delayed by a set delay again and generates a second pump enable control signal PEC2 based on the delayed matching clock signal MCLK. For example, in FIG. 7, the delay unit 148 outputs as the second pump enable control signal PEC2 a waveform PE2 that is delayed by a delay time T20 from a point in time when the matching clock signal MCLK is provided.

The matching clock signal MCLK delayed through the delay unit 148 may be provided as a delay input of a different memory die.

Meanwhile, a $K^{th}$ memory die 120 forming another memory chip may be adjacent to the second memory die 110. The $K^{th}$ memory die 120 includes a delay unit 149 that generates a $K^{th}$ pump enable control signal PEC3.

For example, in FIG. 7, the delay unit 149 outputs as the $K^{th}$ pump enable control signal PEC3 a waveform PE3 that is delayed by a delay time T30 from a point in time when the matching clock signal MCLK outputted from the delay unit 149 is provided.

As illustrated in FIG. 6, a single matching clock signal is delayed without using die codes that uniquely identify memory dies. Accordingly, all charge pumps of memory dies implemented in the multi-die memory structure of FIG. 6 do not operate at the same time but in a time-distributed manner, thereby reducing the peak current consumption in the semiconductor memory device.

Figure 8:
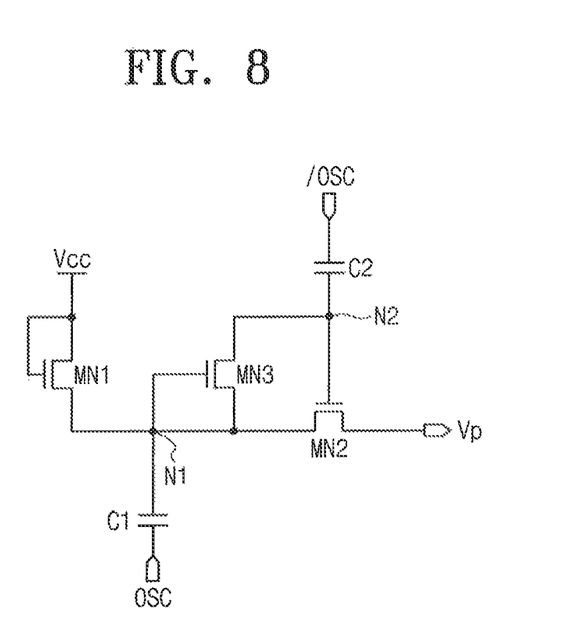
FIG. 8 is a circuit diagram illustrating a charge pump circuit applied to a semiconductor memory device according to an exemplary embodiment of the inventive concept.
Figure 9:
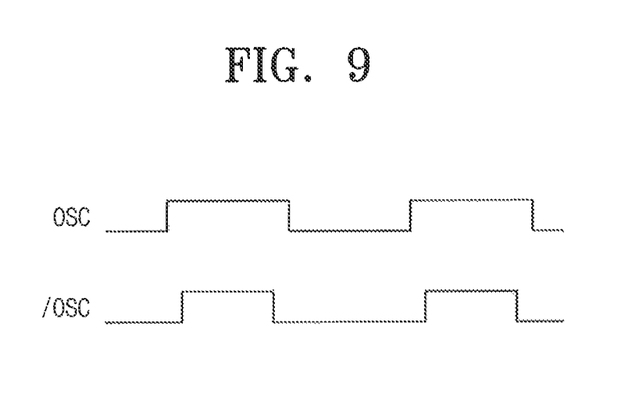
FIG. 9 is a timing diagram of the charge pump circuit shown in FIG. 8 according to an exemplary embodiment of the inventive concept.

FIG. 8 is a circuit diagram illustrating a circuit applied to a semiconductor memory device according to an embodiment of the inventive concept. FIG. 9 is a timing diagram of the charge pump circuit shown in FIG. 8.

Referring to FIG. 8, a charge pump circuit includes a first metal oxide semiconductor MOS (e.g., an n-channel MOS (NMOS)) transistor MN1. The first MOS transistor MN1 receives a power supply voltage Vcc via a gate and drain terminal thereof to supply an initial voltage to a first node N1 via a source terminal thereof. The charge pump circuit may further include a main capacitor. A first capacitor C1 as the main capacitor has a capacitance value. One plate of the first capacitor C1 is connected to the first node N1, and the first capacitor C1 is connected to receive a first oscillation signal OSC to be applied to the other plate thereof. Gate and source terminals of a third MOS transistor MN3 are connected to the first node N1 to provide a current of the first node N1 to the gate and source terminals thereof. In an embodiment, a capacitance value of a second capacitor C2 as a sub-capacitor is lower than that of the first capacitor C1. One plate of the second capacitor C2 is connected to a second node N2 and the second node N2 is connected to a drain terminal of the third MOS transistor MN3. The second capacitor C2 receives a second oscillation signal /OSC to be applied to the other plate of the second capacitor C2. A drain terminal of a second MOS transistor MN2 is connected to the first node N1, and a gate terminal of the second MOS transistor MN2 is connected to the second node N2. A source terminal of the second MOS transistor MN2 is connected to an output terminal Vp and applies a voltage of the first node N1 to the output terminal Vp in response to a voltage of the second node N2. In an embodiment, the oscillation signals (e.g., OSC and /OSC) are oscillation clock signals received from a pump driver 154.

Here, each of the first to third transistors MN1 to MN3 of the charge pump circuit may be an NMOS transistor, and each of the first and second capacitors C1 and C2 may be a MOS capacitor having different capacitance values.

The first oscillation signal OSC is a clock signal that periodically oscillates and is generated by an oscillator formed in the semiconductor memory device, and the first oscillation signal OSC may have a waveform OSC illustrated in FIG. 9. In an embodiment, a period of the second oscillation signal /OSC is the same as that of the first oscillation signal OSC, a pulse width of the second oscillation signal /OSC is smaller than that of the first oscillation signal OSC, and the second oscillation signal /OSC may have a waveform /OSC illustrated in FIG. 9. An output voltage of the charge pump circuit may be supplied to the output terminal Vp of FIG. 8.

In FIG. 8, gate and source terminals (or a drain terminal) of the first NMOS transistor MN1 may be connected to the power supply voltage Vcc, and the drain (or the source) terminal thereof may be connected to the first node N1. An initial voltage of the first node N1 may be set to a voltage of (Vcc−Vth) (Vth being a threshold voltage of the first NMOS transistor MN1 and Vcc being the power supply voltage). When a voltage of the first node N1 is higher than the power supply voltage Vcc after the setting of the initial voltage of the first node N1, the first NMOS transistor MN1 may prevent a current from flowing backward from the first node N1 to the power supply voltage Vcc. Moreover, the source (or drain) terminal of the second NMOS transistor MN2 may be connected to the node N1, the drain (or source) terminal of the second NMOS transistor MN2 may be connected to the output terminal Vp, and the gate terminal of the second NMOS transistor MN2 may be connected to the second node N2. When a voltage of the first node N1 is higher than that of the output terminal Vp, the second NMOS transistor MN2 is turned on to allow a current to flow from the first node N1 to the output terminal Vp. In contrast, when a voltage of the output terminal Vp is higher than a voltage of the first node N1, the second NMOS transistor MN2 is turned off to prevent a current from flowing backward from the output terminal Vp to the first node N1. In addition, gate and source (or drain) terminals of the third NMOS transistor MN3 may be connected to the first node N1, and the drain (or the source) terminal thereof may be connected to the second node N2. When a voltage of the first node N1 is higher than a voltage of the second node N2, the third NMOS transistor MN3 is turned on to allow a current to flow from the first node N1 to the second node N2. In contrast, when a voltage of the second node N2 is higher than a voltage of the first node N1, the third NMOS transistor MN3 may prevent a current from flowing backward from the second node N2 to the first node N1. The first and third transistors MN1 and MN3 perform a diode function and may be implemented or manufactured with diodes that have the same electrical characteristics if needed.

In FIG. 8, one electrode (or referred to as "one plate") of the first capacitor C1 is connected to the first node N1, and the other electrode is connected to receive the first oscillation signal OSC. In an embodiment of the inventive concept, a capacitance value of the first capacitor C1 is designed to be greater than all other capacitance values that are present on the first node N1. One electrode of the second capacitor C2 is connected to the second node N2, and the other electrode is connected to receive the second oscillation signal /OSC. In an embodiment of the inventive concept, a capacitance value of the second capacitor C2 is designed to be greater than that of all other capacitance values that are present on the second node N2 and has a capacitance value that is less than half the capacitance value of the first capacitor C1.

Here, the circuit of FIG. 8 indicates a one unit charge pump. A plurality of unit charge pumps may be connected in parallel or in series to the output terminal Vp based on a design of a semiconductor memory device. For example, when the unit charge pump of FIG. 8 has the ability to generate about 3 V, two charge pumps each of which is the unit charge pump of FIG. 8 may additionally be connected to the output terminal Vp to generate a pumping voltage of 9 V. In this case, the first NMOS transistor MN1 of FIG. 8 may be excluded. In addition, to maintain the pumping voltage and to increase the intensity of the current, the unit charge pumps may be connected in parallel. Output voltages of the charge pumps may be provided to a common output terminal.

An operation of the circuit of FIG. 8 having the above-described configuration will be described. When the power supply voltage Vcc is applied to the charge pump circuit of FIG. 8, an initial voltage of the first node N1 may indicate a voltage of (Vcc−Vth) (Vth being a threshold voltage of the first NMOS transistor MN1). In addition, an initial voltage of the second node N2 may indicate a voltage of (2Vcc−Vth). At this time, when the voltage of the first oscillating signal OSC is changed from a ground voltage to the power supply voltage Vcc, a voltage of the first node N1 may be increased by the changed voltage level of the first oscillating signal OSC. This is because a capacitance value of the main capacitor C1 is greater than that of the node N1. Thus, the voltage of the first node N1 may be increased due to a coupling effect by the changed voltage level of the first oscillating signal OSC. That is, a voltage of the first node N1 may be a voltage boosted by a power supply voltage Vcc from the initial voltage of the first node N1. At this time, a level of the boosted voltage may be a level of a voltage of (2Vcc−Vth). Thus, a voltage of the second node N2 may be a voltage of (2Vcc−2Vth) (Vth being a threshold voltage of an NMOS transistor).

At this time, as illustrated in FIG. 9, the second oscillation signal /OSC may be inputted to the second capacitor C2 and may have a duty different from the duty of the first oscillation signal OSC. When the voltage of the second oscillating signal /OSC is changed from a ground voltage to the power supply voltage Vcc, most of the voltage variation of the second capacitor C2 due to a coupling effect may be transferred to the second node N2. As a result, a voltage of the second node N2 may be a voltage of (3Vcc−2Vth). Thus, as described with reference to FIG. 8, when a voltage of the first node N1 is applied to the output terminal Vp through the second NMOS transistor MN2 (i.e., when a voltage of the first node N1 being a drain or a source terminal of the second NMOS transistor MN2 is a voltage of (2Vcc−Vth)), a voltage of the second node N2, to which a gate terminal of the second NMOS transistor MN2 is connected, may be a voltage of (3Vcc−2Vth) . Accordingly, a voltage difference corresponding to a voltage of (Vcc−Vth) may occur between the gate and drain terminals of the second NMOS transistor MN2, and thus a voltage of the first node N1 may be directly applied to the output terminal Vp without voltage loss due to the second NMOS transistor MN2.

In FIG. 8, a drain terminal and a source terminal of a transistor may be changed, and a diode may be replaced with the transistor. In addition, it is possible to connect additional unit charge pumps in series and parallel to increase the pumping capacity of the charge pump circuit.

According to an embodiment of the inventive concept, when charge pumps each of which is substantially the same as that illustrated in FIG. 8 are implemented on each memory die, the charge pumps do not operate at the same time but in a time-distributed manner, thereby minimizing the consumption of peak current.

Figure 10:
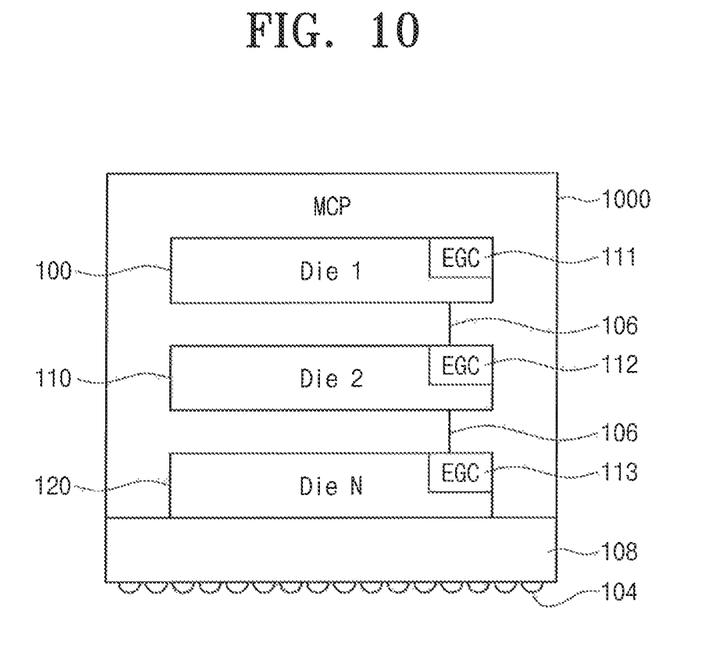
FIG. 10 is a drawing illustrating a configuration of a multi-chip package having a multi-die memory structure applied to an embodiment of the inventive concept.

FIG. 10 is a drawing illustrating a configuration of a multi-chip package having a multi-die memory structure applied to an embodiment of the inventive concept.

Referring to FIG. 10, the plurality of memory dies 120, 110 and 100 are sequentially stacked on an upper surface of a substrate 108. The first memory die 100 includes a first enable signal generating circuit (EGC) 111, the second memory die 110 includes a second enable signal generating circuit (EGC) 112, and a $N^{th}$ memory die 120 includes a $N^{th}$ enable signal generating circuit (EGC) 113. Here, N may be a natural number of 3 or more.

Each of the first enable signal generating circuit (EGC) 111, the second enable signal generating circuit (EGC) 112 and the Nth enable signal generating circuit (EGC) 113 may correspond to the above-described non-overlapping enable signal generating circuit 140 of FIG. 1.

A plurality of charge pumps that generate various voltages using an external power may be implemented within each of the plurality of memory dies 100, 110, and 120.

The plurality of memory dies 100, 110, and 120 may be packaged in one package 1000 and may be formed in a multi-chip package (MCP) structure. A plurality of bumps 104 for electrical connection are formed on a lower surface of the substrate 108. The bumps 104 may be made of a conductive material. The plurality of memory dies 100, 110, and 120 may be electrically connected to a processor or a memory controller, which is placed on the lower surface of the substrate 108, using the bumps 104.

The memory dies 100, 110, and 120 may receive an address, a command, or data through an interconnection line 106. The interconnection line 106 may be formed using a through-silicon via (TSV). The TSV may indicate "through silicon via".

When a plurality of memory dies are vertically stacked within one package or horizontally disposed on the same plane within one package, charge pumps that are in each memory die do not operate at the same time but in a time-distributed manner, thereby minimizing the consumption of peak current.

According to an embodiment of the inventive concept, charge pumps in a multi-die memory structure do not operate at the same time to reduce current consumption, thereby reducing a peak current in a memory system or multi-die memory device.

While the inventive concept has been described with reference to exemplary embodiments, it will be apparent to those skilled in the art that various changes and modifications may be made without departing from the spirit and scope of the inventive concept.

What is claimed is:
1. A semiconductor memory device, comprising:
    a first memory die comprising at least one first charge pump and a first control circuit configured to control driving of the at least one first charge pump during a time period; and
    a signal generator configured to generate a control signal that prevents the at least one first charge pump of the first memory die from being driven at a same time with at least one second charge pump in a second memory die different from the first memory die and to apply the generated control signal to the first control circuit and a second control circuit of the second memory die that is configured to control driving of the at least one second charge pump, wherein the signal generator generates the control signal using a clock signal provided from a memory controller.

2. The semiconductor memory device of claim 1, further comprising:
a memory configured to store a first die code for identifying the first memory die and a second die for identifying the second memory die, wherein the control signal indicates the first die code when the at least one first charge pump is be driven and the control signal indicates the second die code when the at least one second charge pump is to be driven.

3. The semiconductor memory device of claim 2, wherein the signal generator generates the control signal when logical states of first and second clock signals are the same as logical states of the die code stored.

4. The semiconductor memory device of claim 2, wherein the signal generator delays a clock signal by a delay time to generate the control signal, wherein the delay time varies according to the die code.

5. The semiconductor memory device of claim 1, wherein the signal generator delays a clock signal by a delay time to generate the control signal.

6. The semiconductor memory device of claim 5, wherein the signal generator provides the delayed clock signal as a delay input of the second memory die.

7. The semiconductor memory device of claim 1, wherein the first control circuit comprises an oscillator, and
wherein an oscillation operation of the oscillator is enabled by the control signal.

8. The semiconductor memory device of claim 1, wherein the first memory die and the second memory die constitute a multi-chip package.

9. The semiconductor memory device of claim 1, wherein the first memory die and the second memory die are connected to each other through a through silicon via (TSV).

10. The semiconductor memory device of claim 2, wherein the first control circuit drives the at least one first charge pump when the first die code is stored in the first memory die and the control signal indicates the first die code.

11. A semiconductor memory device, comprising:
a first memory die comprising a first charge pump;
a control circuit configured to control driving of the first charge pump during a first time period; and
a signal generator configured to generate a control signal that causes the first charge pump of the first memory die to be active and another second charge pump in a second memory die different from the first memory die to be inactive during the first time period, and causes the first charge pump to be inactive and the second charge pump to be active during a second time period different from the first time period,
wherein the signal generator generates the control signal using at least one received clock signal.

12. The semiconductor memory device of claim 11, wherein the first charge pump generates a voltage at a level higher than a level of a power supply voltage.

13. The semiconductor memory device of claim 11, wherein the at least one received clock signal is generated in the first memory die or the second memory die.

14. The semiconductor memory device of claim 11, wherein the first memory die and the second memory die are disposed in separate planes and commonly connected to one memory controller.

15. A semiconductor memory device, comprising:
a first memory die storing a first code and including a clock signal generator and a first controller,
wherein the clock signal generator is configured to generate first and second clock signals that together indicate one of the first code and a second code of a second memory die,
wherein the first controller activates a first charge pump in the first memory die when the first and second clock signals indicate the first code, and
wherein the first controller deactivates the first charge pump when the first and second clock signals indicate the second code.

16. The semiconductor memory device of claim 15, further comprising:
the second memory die comprising a second charge pump and a second controller,
wherein the second controller deactivates the second charge pump when the first and second clock signals indicate the first code, and
wherein the second controller activates the second charge pump when the first and second clock signals indicate the second code.

17. The semiconductor memory device of claim 15, wherein the memory dies are stacked on top of one another.

18. The semiconductor memory device of claim 15, wherein the first clock signal identifies a first bit of the indicated one code and the second clock signal identifies a second bit of the indicated one code.

19. The semiconductor memory device of claim 15, wherein the clock signal generator generates the clock signals so they alternate between indicating the first code and the second code.

* * * * *